(12) United States Patent
Kang et al.

(10) Patent No.: US 12,726,216 B2
(45) Date of Patent: Sep. 1, 2026

(54) CODING CIRCUIT AND MEMORY DEVICE INCLUDING THE SAME

(71) Applicants: SK hynix Inc., Icheon-si (KR); KOREA UNIVERSITY RESEARCH AND BUSINESS FOUNDATION, Seoul (KR)

(72) Inventors: Seongyoon Kang, Seoul (KR); Jongsun Park, Seoul (KR); Munseon Jang, Icheon-si (KR)

(73) Assignees: SK hynix Inc., Icheon-si (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 134 days.

(21) Appl. No.: 18/637,224

(22) Filed: Apr. 16, 2024

(65) Prior Publication Data

US 2025/0183916 A1 Jun. 5, 2025

(30) Foreign Application Priority Data

Dec. 1, 2023 (KR) ........................ 10-2023-0172311

(51) Int. Cl.
*H03M 13/17* (2006.01)
*H03M 13/15* (2006.01)

(52) U.S. Cl.
CPC ....... *H03M 13/17* (2013.01); *H03M 13/1545* (2013.01)

(58) Field of Classification Search
CPC .......................... H03M 13/17; H03M 13/1545
See application file for complete search history.

(56) References Cited

U.S. PATENT DOCUMENTS

| | | | | |
|---|---|---|---|---|
| 4,468,769 A * | 8/1984 | Koga | H03M 13/15 714/759 |
| 4,604,655 A * | 8/1986 | Moriyama | G11B 20/1833 386/265 |
| 4,604,747 A * | 8/1986 | Onishi | G11B 20/1809 |
| 5,938,790 A * | 8/1999 | Marrow | G11B 20/10296 714/824 |

(Continued)

FOREIGN PATENT DOCUMENTS

| | | |
|---|---|---|
| KR | 10-1234373 B1 | 2/2013 |
| KR | 10-2021-0080807 A | 7/2021 |

OTHER PUBLICATIONS

Nersten Criss et al., “Improving Memory Reliability by Bounding DRAM Faults: DDR5 improved reliability features,” International Symposium on Memory Systems, ACM, Sep. 2020, pp. 317-322, doi: 10.1145/3422575.3422803.

(Continued)

*Primary Examiner* — Joseph D Torres

(57) ABSTRACT

A coding circuit includes an encoder circuit generating parity by applying input data to a parity generating matrix and generating an input codeword by concatenating the input data and the parity; and a decoder circuit detecting and correcting an error included in an output codeword based on a first syndrome, a second syndrome, and a third syndrome for identifying an error boundary. The first, second, and third syndromes are generated by applying the output codeword to the parity generating matrix.

18 Claims, 7 Drawing Sheets

(56) References Cited

U.S. PATENT DOCUMENTS

| | | | | |
|---|---|---|---|---|
| 8,972,833 B1 * | 3/2015 | Rahul | G06F 11/00 | 714/800 |
| 2008/0104487 A1 * | 5/2008 | Usui | H03M 13/09 | 714/785 |
| 2014/0195881 A1 * | 7/2014 | Srivastava | H03M 13/151 | 714/782 |
| 2017/0004036 A1 * | 1/2017 | Ha | G11C 29/52 | |

OTHER PUBLICATIONS

I. S. Reed et al., "Polynomial Codes Over Certain Finite Fields," J. Soc. Ind. Appl. Math., Jun. 1960, pp. 300-304, vol. 8, No. 2.

Tae-Young Oh et al., "A 3.2 Gbps/pin 8 Gbit 1.0 V LPDDR4 SDRAM With Integrated ECC Engine for Sub-1 V DRAM Core Operation," IEEE J. Solid-State Circuits, Jan. 2015, pp. 178-190, vol. 50, No. 1, doi: 10.1109/JSSC.2014.2353799.

Dongkyun Kim et al., "A 1.1V 1ynm 6.4Gb/s/pin 16Gb DDR5 SDRAM with a Phase-Rotator-Based DLL, High-Speed SerDes and RX/TX Equalization Scheme," 2019 IEEE International Solid-State Circuits Conference (ISSCC), Feb. 2019, pp. 380-382, doi: 10.1109/ISSCC.2019.8662320.

Uksong Kang et al., "Co-Architecting Controllers and DRAM to Enhance DRAM Process Scaling," Computer Archtecture and Memory Systems Lab, Memory Forum 2014, 2014.

Sudhanva Gurumurthi et al., "HBM3 RAS: Enhancing Resilience at Scale," IEEE Comput. Archit. Lett., Jul. 2021, pp. 158-161, vol. 20, No. 2, doi: 10.1109/LCA.2021.3117150.

Sangmok Jeong et al., "PAIR: Pin-aligned In-DRAM ECC architecture using expandability of Reed-Solomon code," 2020 57th ACM/IEEE Design Automation Conference (DAC), Jul. 2020.

Irina Alam et al., "COMET: On-die and In-controller Collaborative Memory ECC Technique for Safer and Stronger Correction of DRAM Errors," 2022 52nd Annual IEEE/IFIP International Conference on Dependable Systems and Networks (DSN), Jun. 2022, pp. 124-136, doi: 10.1109/DSN53405.2022.00024.

Sung-Il Pae et al., "Minimal Aliasing Single-Error-Correction Codes for DRAM Reliability Improvement," IEEE Access, 2021, pp. 29862-29869, vol. 9, doi: 10.1109/ACCESS.2021.3059843.

Micron, "DDR5 SDRAM Product Core Data Sheet," 2020.

Prashant J. Nair et al., "XED: exposing on-die error detection information for strong memory reliability," 2016 ACM/IEEE 43rd Annual International Symposium on Computer Architecture, 2016, pp. 341-353.

Minesh Patel et al., "Bit-Exact ECC Recovery (BEER): Determining DRAM On-Die ECC Functions by Exploiting DRAM Data Retention Characteristics," Best Paper Award, Micro, 2020.

R. C. Bose et al., "On a class of error correcting binary group codes," Inf. Control, 1960, pp. 68-79, vol. 3, No. 1, doi: 10.1016/S0019-9958(60)90287-4.

Chia-Ching Chu et al., "A fully parallel BCH codec with double error correcting capability for NOR flash applications," 2012 IEEE International Conference on Acoustics, Speech and Signal Processing (ICASSP), 2012, pp. 1605-1608.

* cited by examiner

Input Data
Padding Data
120
130
110
Parity Generator
Parity
140
Input Codeword
First Syndrome,
Second Syndrome,
Third Syndrome
Output Codeword
100

16 bits
8 bits
Odd error decision rows
Error boundary decision rows
First Syndrome Generating Matrix
Second Syndrome Generating Matrix
Third Syndrome Generating Matrix
Error boundary #0
Error boundary #1
Error boundary #7

FIB. 6C

CODING CIRCUIT AND MEMORY DEVICE INCLUDING THE SAME

CROSS-REFERENCE TO RELATED APPLICATION

The present application claims priority under 35 U.S.C. § 119 (a) to Korean Patent Application No. 10-2023-0172311, filed on Dec. 1, 2023, which is incorporated herein by reference in its entirety.

BACKGROUND

1. Technical Field

Various embodiments generally relate to a coding circuit and a memory device including the coding circuit.

2. Related Art

In a conventional memory system, a memory controller corrects errors in data output from a memory device on a symbol-by-symbol basis. It is common to use a Reed-Solomon (RS) code to correct errors on a symbol-by-symbol basis.

The RS code corrects errors on a symbol-by-symbol basis, so for example, if it has a 1-symbol error correction capability, errors within 1 symbol can be corrected regardless of the number of error bits.

A technology has been proposed to double protect data by adding a coding circuit inside the memory device. The coding circuit inside the memory device is also referred to as an in-memory coding circuit.

Conventional in-memory coding circuits generally apply Bose-Chaudhuri-Hocquenghem (BCH) coding technology capable of 2-bit error correction.

However, when applying the conventional BCH coding technology, if an error that exceeds the error correction capability, for example, an error of 3 or more bits occurs, additional errors may occur while incorrectly correcting the error.

Therefore, although the error can be corrected by the memory controller if the in-memory coding circuit is not applied, a problem occurs in which the memory controller cannot correct the error if an additional error exceeds the boundary of the data symbol due to the in-memory coding circuit.

SUMMARY

In accordance with an embodiment of the present disclosure, a coding circuit may include an encoder circuit configured to generate parity by applying input data to a parity generating matrix and generate an input codeword by concatenating the input data and the parity; and a decoder circuit configured to detect and correct an error included in an output codeword based on a first syndrome, a second syndrome, and a third syndrome for identifying an error boundary, the first, second, and third syndromes being generated by applying the output codeword to the parity generating matrix.

In accordance with an embodiment of the present disclosure, a memory device may include a memory cell array; and a coding circuit configured to provide an input codeword to the memory cell array by encoding input data, and to generate output data and a detection signal by decoding output codeword output from the memory cell array. The coding circuit includes: an encoder circuit configured to generate parity by applying the input data to a parity generating matrix and generate the input codeword by concatenating the input data and the parity; and a decoder circuit configured to detect and correct an error included in the output codeword based on a first syndrome, a second syndrome, and a third syndrome for identifying an error boundary, the first, second, and third syndromes being generated by applying the output codeword to the parity generating matrix.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

FIGS. 6A, 6B, and 6C illustrate an operation of an error boundary decision circuit according to an embodiment of the present disclosure.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit embodiments of this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
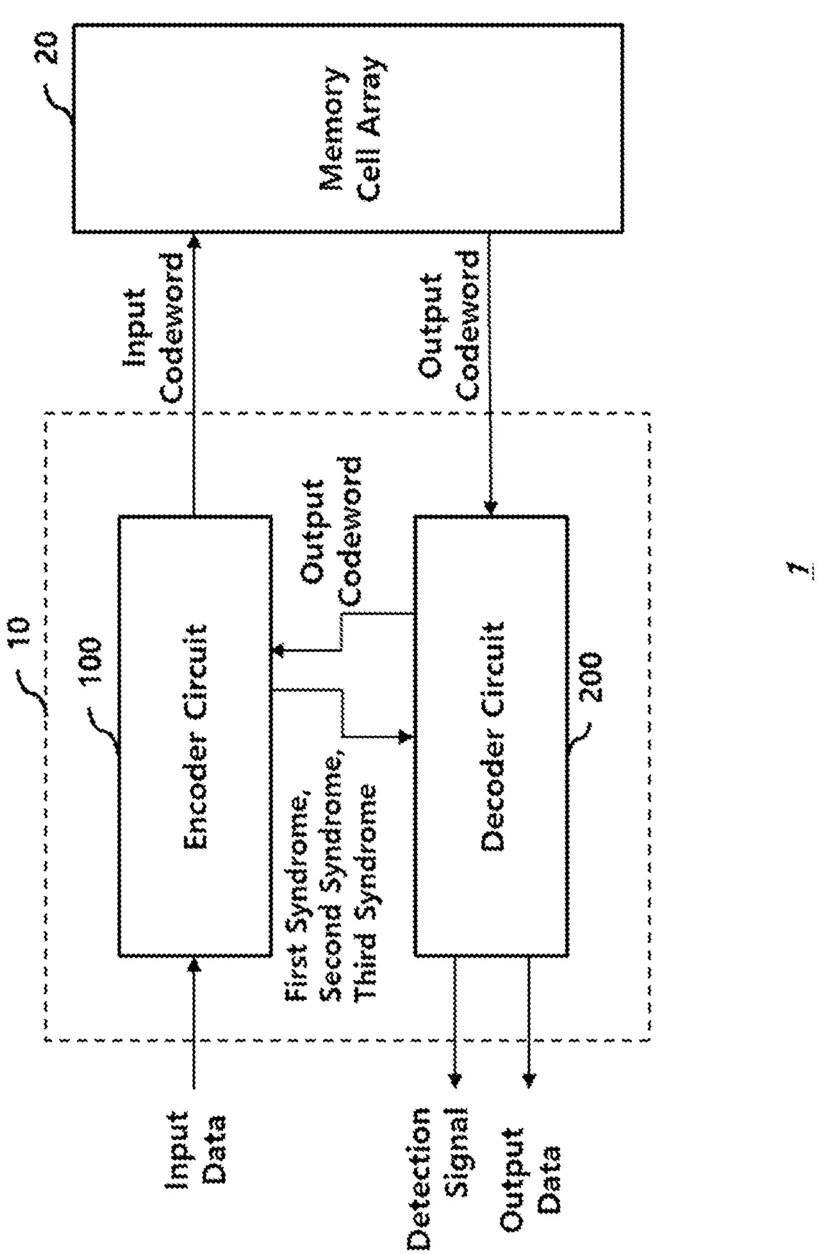
FIG. 1 illustrates a memory device according to an embodiment of the present disclosure.

FIG. 1 is a block diagram showing a memory device 1 according to an embodiment of the present disclosure.

The memory device 1 according to an embodiment of the present disclosure includes a coding circuit 10 and a memory cell array 20.

The memory cell array 20 stores an input codeword generated by the coding circuit 10 during a write operation and provides an output codeword output during a read operation to the coding circuit 10.

The coding circuit 10 includes an encoder circuit 100 that encodes input data to generate the input codeword, and a decoder circuit 200 that decodes the output codeword to generate output data and a detection signal.

The decoder circuit 200 provides the output codeword to the encoder circuit 100, corrects errors by referring to first to third syndromes generated from the encoder circuit 100, and generates the output data.

At this time, parities generated by applying the output codeword to the parity generating matrix is referred to as syndromes and the syndromes include the first syndrome, the second syndrome, and the third syndrome.

The first syndrome corresponds to syndrome #0 S0 among syndromes generated in the conventional BCH decoding circuit.

The second syndrome may include one or more portions corresponding to one or more syndromes, respectively. For example, the second syndrome includes syndrome #1 S1 as a first portion and syndrome #3 S3 as a second portion, among the syndromes generated in the conventional BCH decoding circuit.

The third syndrome is an error boundary decision syndrome and is used to determine whether an error occurring as a result of decoding exceeds a boundary between data symbols. Hereinafter, the boundary between data symbols may be referred to as an error boundary.

The method of determining whether an error boundary has been exceeded using the error boundary decision syndrome will be described in more detail below.

The memory device 1 may further include one or more circuits (e.g., control circuit) necessary for reading or writing data. These circuits and operations thereof may be known in the art, and thus detailed description thereof may be omitted for the interest of brevity.

Figure 2:
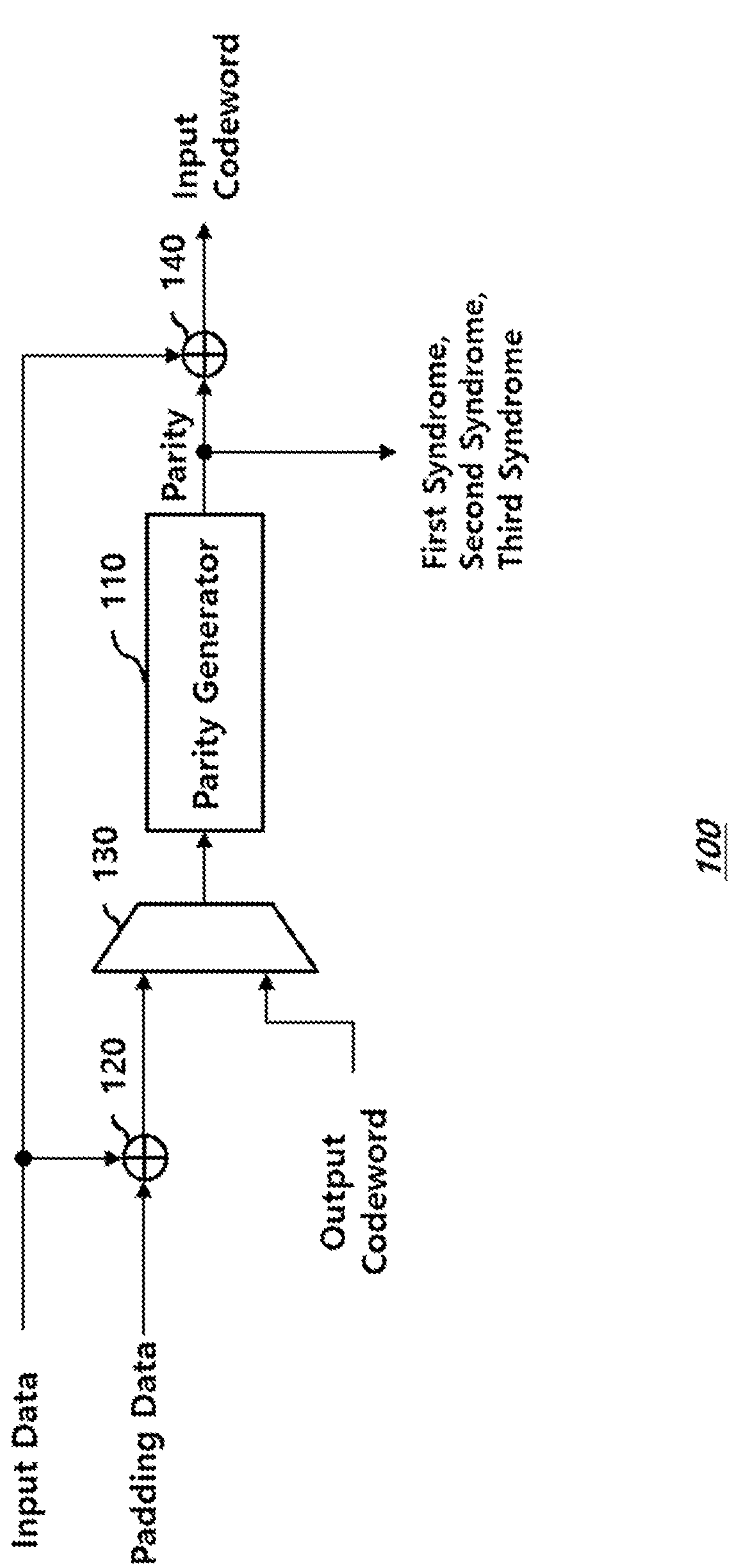
FIG. 2 illustrates an encoder circuit according to an embodiment of the present disclosure.

FIG. 2 is a block diagram showing the encoder circuit 100 according to an embodiment of the present disclosure.

The encoder circuit 100 includes a parity generator 110, a first concatenation circuit 120, a selection circuit 130, and a second concatenation circuit 140.

The parity generator 110 generates parity by applying an output (e.g., selection data) from the selection circuit 130 to a parity generating matrix.

In this embodiment, it is assumed that each of the input data and the output data includes 128 bits, one parity symbol includes 24 bits, and one data symbol includes 16 bits.

Accordingly, each of the selection data, the input codeword, and the output codeword includes 152 bits.

Figure 3:
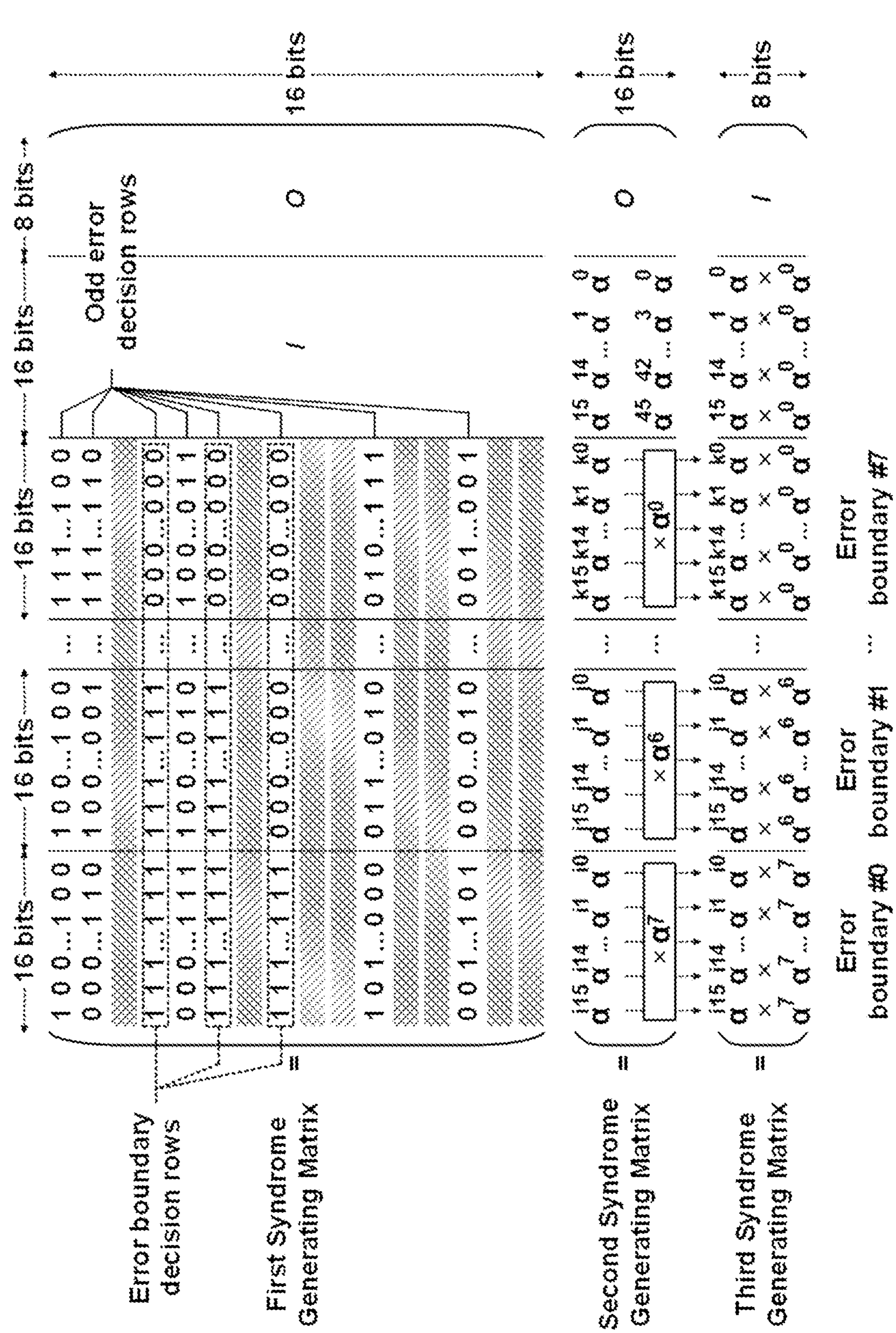
FIG. 3 illustrates a parity generating matrix according to an embodiment of the present disclosure.

FIG. 3 shows a parity generating matrix according to an embodiment of the present disclosure.

In this embodiment, the parity generating matrix has dimensions of 40×152.

In FIG. 3, a 32×144 dimensional matrix consisting of the top 32 rows and the leftmost 144 columns corresponds to a parity generating matrix used in the conventional BCH coding technology.

In embodiments of the present disclosure, by imposing specific conditions while configuring the conventional parity generating matrix and by expanding the conventional parity generating matrix, additional errors are prevented from occurring beyond an error boundary.

In FIG. 3, the top 16 rows correspond to a first syndrome generating matrix that generates the first syndrome, the middle 16 rows correspond to a second syndrome generating matrix that generates the second syndrome, and the bottom 8 rows correspond to a third syndrome generating matrix that generates the third syndrome which is the error boundary decision syndrome. For example, the first syndrome generating matrix may include a plurality of odd error decision rows (e.g., eight odd error decision rows in FIG. 3) to determine whether an odd number of errors exist and include a plurality of error boundary decision rows (e.g., three error boundary decision rows in FIG. 3) to determine a target error boundary where the error occurred among a plurality of error boundaries, as will be described below in more detail.

In the first syndrome generating matrix, the 16×128 dimension matrix on the left corresponds to a transposed coefficient matrix. The transposed coefficient matrix is a matrix in which a transpose operation is performed on a coefficient matrix, which is a P matrix, and the coefficient matrix corresponds to a part of a generating matrix, which is a G matrix.

The relationship between the generating matrix and the coefficient matrix is known in or obvious from the conventional BCH coding technology, therefore detailed descriptions thereof are omitted for the interest of brevity.

I and O included in the first syndrome generating matrix represent an identity matrix with 16×16 dimension and a zero matrix with 16×8 dimension, respectively, O included in the second syndrome generating matrix represents a zero matrix with 16×8 dimension, and I included in the third syndrome generating matrix represents an identity matrix with 8×8 dimension.

In this embodiment, the parity generating matrix generates a syndrome to detect locations where odd or even number of errors occur and thereby prevents these errors from occurring beyond a symbol boundary or an error boundary.

Each element constituting the transposed coefficient matrix can be selected based on various criteria.

In embodiments of the present disclosure, in order to prevent spread of errors beyond an error boundary, the following two conditions must be satisfied when generating the transposed coefficient matrix.

First, the transposed coefficient matrix is determined to include a number of odd error decision rows. An odd error decision row refers to a row in which number of 1's included in one row is odd. FIG. 3 illustrates a case where the transposed coefficient matrix includes eight odd error decision rows.

Second, the transposed coefficient matrix includes a plurality of error boundary decision rows.

In the plurality of error boundary decision rows, all columns corresponding to one error boundary must have the same composition, and different error boundaries have different compositions.

FIG. 3 illustrates a case where each of the error boundary includes 16 bits and the transposed coefficient matrix includes three error boundary decision rows.

For example, all 16 columns included in the three error boundary decision rows and corresponding to an error boundary #0 have the same configuration (e.g., value) as "111," and all 16 columns included in the three error boundary decision rows and corresponding to an error boundary #1 have the same configuration as "110." In addition, the 16 columns included in the three error boundary decision rows and corresponding to the error boundary #0 have different configuration (e.g., "111") from that (e.g., "110") of the 16 columns included in the three error boundary decision rows and corresponding to the error boundary #1.

The number of error boundary decision rows can be determined depending on number of data symbols. In this embodiment, since there are 8 symbols in the data, 3 error boundary decision rows are required to identify the 8 error boundaries.

The principle of generating the second syndrome generating matrix is substantially the same as the principle of generating the syndrome #1 and the syndrome #3 generation matrices used in the conventional BCH decoding technology. The syndrome #1 and the syndrome #3 are determined according to the column arrangement of the transposed coefficient matrix in the first syndrome generating matrix.

The value displayed in the form of an in FIG. 3 is a finite field value that is an element of the Galois field and has an 8-bit value in this embodiment.

The 8-bit value assigned to the third syndrome generating matrix is determined by multiplying the eigenvalue of the 8-bit finite field at the top of the second syndrome generating matrix that generates the syndrome #1.

Eigenvalues are given as different values for different error boundaries, and the same eigenvalue is used inside a single error boundary.

For example, in FIG. 3, the leftmost 16 columns of the third syndrome generating matrix correspond to error boundary #0, and have the form of multiplying the eigenvalue $\alpha^7$ with $\alpha^{i15}$ $\alpha^{i14}$ . . . $\alpha^{i1}$ $\alpha^{i0}$, which are 8-bit finite field values in the upper part for generating the syndrome #1 in the second syndrome generating matrix.

Accordingly, if the value obtained by dividing the error boundary decision syndrome by the syndrome #1 S1 is equal to $\alpha^7$, which is the eigenvalue for the error boundary #0, it can be determined that an error occurred inside the error boundary #0.

Returning to FIG. 2, the selection circuit 130 selects an output of the first concatenation circuit 120 during a write operation and selects the output codeword during a read operation. The output of the first concatenation circuit 120 or the output codeword selected by the selection circuit 130 may be referred to as "selection data" in the present disclosure.

That is, during a write operation, the parity generator 110 generates parities corresponding to the input data, and during a read operation, the parity generator 110 generates syndromes corresponding to the output codeword.

The first concatenation circuit 120 concatenates padding data following the input data. In this embodiment, the padding data includes padding bits of a first value (e.g., '0'), and the number of the padding bits are 24, which is the same as the number of parity bits.

The second concatenation circuit 140 generates the input codeword by concatenating 128 bits of input data followed by 24 bits of parities.

Figure 4:
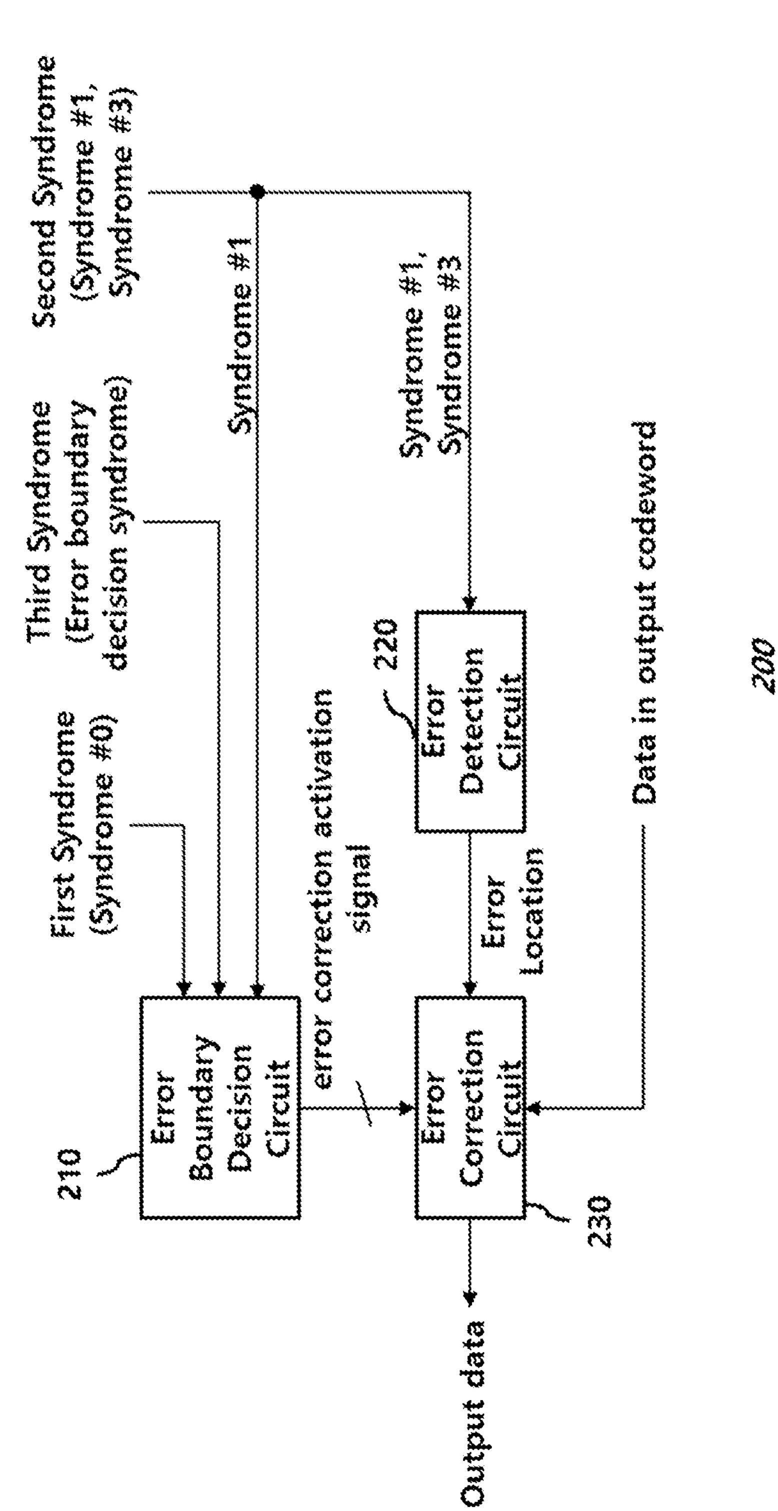
FIG. 4 illustrates a decoder circuit according to an embodiment of the present disclosure.

FIG. 4 is a block diagram showing a decoder circuit 200 according to an embodiment of the present disclosure.

The decoder circuit 200 includes an error boundary decision circuit 210 that generates an error correction activation signal, an error detection circuit 220 that detects an error location based on the second syndrome that includes the syndrome #1 and the syndrome #3, and an error correction circuit 230 that corrects errors in the data included in the output codeword and provides the output data.

Because the error detection circuit 220 that determines the error location according to the syndrome #1 and the syndrome #3 may have substantially the same configuration as that of a conventional BCH decoder circuit with a double error correction function, detailed description thereof will be omitted for the interest of brevity.

The error correction activation signal is a multi-bit signal, and number of bits included therein may be determined depending on the number of error boundaries.

In this embodiment, the error correction activation signal is an 8-bit signal corresponding to eight error boundaries and indicates whether error correction may be performed for each of the eight error boundaries. In other words, the error correction activation signal indicates whether the error correction circuit 230 may perform an error correction operation for one or more of the eight error boundaries.

The error correction circuit 230 performs or does not perform an error correction operation according to the error correction activation signal.

The error boundary decision circuit 210 generates an error correction activation signal using the first syndrome (the syndrome #0), a portion (e.g., the syndrome #1) of the second syndrome, and the third syndrome (the error boundary decision syndrome).

Figure 5:
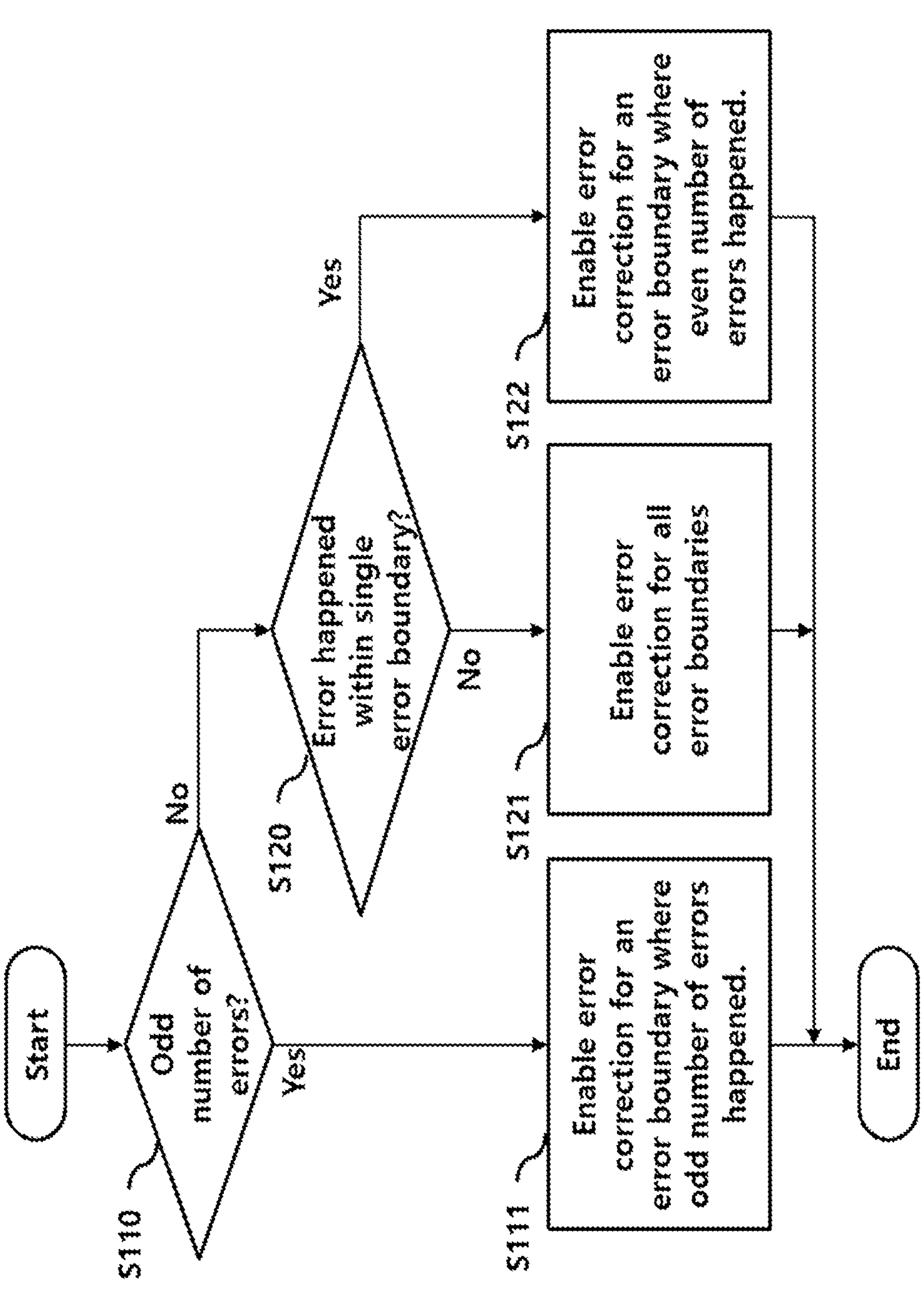
FIG. 5 is a flowchart illustrating an operation of an error boundary decision circuit according to an embodiment of the present disclosure.

FIG. 5 is a flowchart showing an operation of the error boundary decision circuit 210 according to an embodiment, and FIG. 6 is a diagram explaining the error boundary decision operation according to an embodiment.

First, it is determined whether the number of errors in the output codeword is odd at S110.

To determine whether the number of errors is an odd number, the number of 1's in the rows corresponding to the odd error decision rows in the syndrome #0 are added, and if result of addition is odd, the number of errors is determined to be odd. For example, the error boundary decision circuit 210 may sum the logic high values ('1') in the rows of the syndrome #0 that correspond to the odd error decision rows. The error boundary decision circuit 210 may determine that an odd number of errors exist when the sum is odd, and that an even number of errors exist when the sum is even.

Figures 6A, 6B:
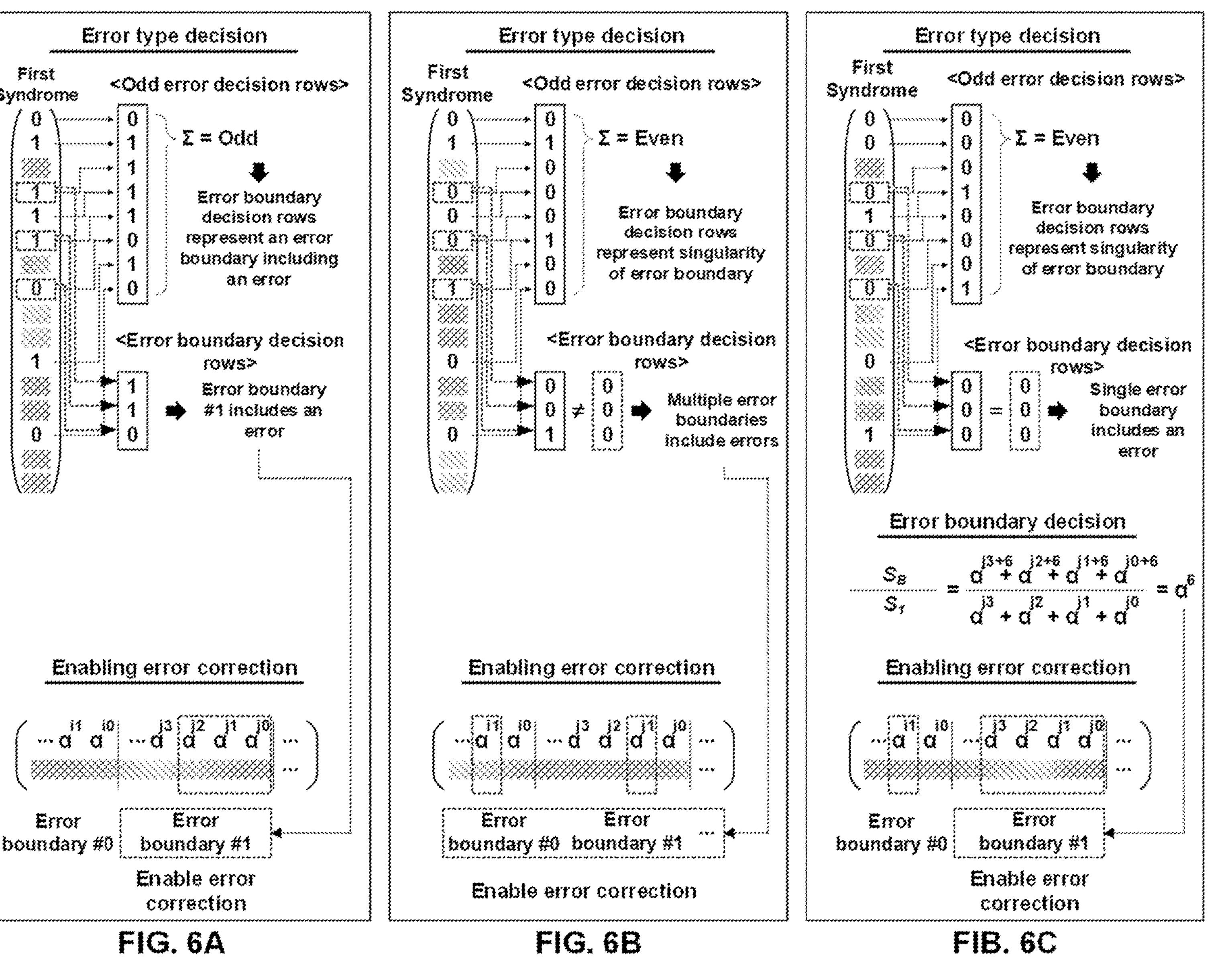

For example, FIG. 6A corresponds to the case where the number of errors is odd, and FIGS. 6B and 6C correspond to the cases where the number of errors is even.

If it is determined that the number of errors is odd, error correction for a target error boundary where odd number of errors occurred is activated at S111.

At this time, in order to identify the target error boundary, a value corresponding to the error boundary decision row in the syndrome #0 is checked.

For example, if odd number of errors occurred in the error boundary #1, "110" is added as many as the number of errors by a bitwise XOR operation, and thus the three error boundary decision rows in the syndrome #0 become "110."

In order to find the target error boundary, the error boundary decision syndrome $S_B$ is divided by the syndrome #1 S1 and a division result is compared with an eigenvalue corresponding to each error boundary. But in the case of odd number of errors occurred, this operation is unnecessary. In other words, when an odd number of errors exists, a value (e.g., "110" in FIG. 6A) represented by a plurality of rows of the syndrome #0 that correspond to the error boundary decision rows indicates the target error boundary (e.g., the error boundary #1 in FIG. 6A) including the error(s), thereby obviating the need to find the target error boundary based on comparisons of the divided value of the error boundary decision syndrome $S_B$ by the syndrome #1 S1 with eigenvalues respectively corresponding to the error boundaries.

As shown in FIG. 6A, when a value corresponding to the three error boundary decision rows in the syndrome #0 is "110," error correction is activated only for the error boundary #1 and error correction is deactivated for the other error boundaries.

The possibility that errors occurred over multiple error boundaries when the number of errors is odd cannot be ruled out. However, in this case, error correction is not possible through a RS coding circuit with 1-symbol correction capability either. Therefore, there is no need to consider this possibility in this embodiment.

If the number of errors is determined to be even at S110, it is determined whether errors occurred within a single error boundary or not at S120.

If the number of errors is even, the error boundary decision rows included in the syndrome #0 are referred to determine whether the error occurred within one error boundary or not.

For example, if an even number of errors occur in the error boundary #1, "110" is added as many as the number of errors through a bitwise XOR operation, so the value of the three error boundary decision rows in the syndrome #0 become "000."

Accordingly, as shown in FIG. 6B, if a value corresponding to the three error boundary decision rows is different from a predetermined value (e.g., "000"), the errors are determined to have occurred over multiple error boundaries, and as shown in FIG. 6C, a value corresponding to the three error boundary decision rows is the same as the predetermined value (e.g., "000"), the errors are determined to have occurred within only a single error boundary.

If the errors are determined to have occurred over multiple error boundaries, error correction is allowed for all error boundaries at S121.

For example, if a 2-bit error occurred over multiple error boundaries, the error is likely to be resolved by the operation of the BCH decoding circuit, so it is desirable to allow error corrections for all error boundaries.

If there are even number of errors where the even number is greater than 2 and the errors are scattered over multiple error boundaries, the error is beyond the error correction capability of the BCH coding circuit or the RS coding circuit of the memory controller assumed in embodiments of the present disclosure and therefore there is no need to consider this possibility in this embodiment.

If errors are confined in only a single error boundary, error correction is allowed only for the corresponding single error boundary and error correction is not allowed for the remaining error boundaries at S122.

For example, though 2 or more even number of errors are included in a single symbol, the errors can be corrected through 1-symbol error correction by a coding circuit included in the memory controller.

Accordingly, the error correction for the corresponding error boundary may be allowed. However, for the remaining error boundaries, it is desirable to block error correction to prevent additional errors from occurring due to incorrect error correction during the error correction process.

In order to find a target error boundary where an error occurred, the error boundary decision syndrome is divided by the syndrome #1 and a result of the division is compared with an eigenvalue corresponding to each error boundary.

In FIG. 6C, because the eigenvalue obtained as described above is equal to $\alpha^6$ corresponding to the error boundary #1, it is determined that the target error boundary is the error boundary #1.

Figure 7:
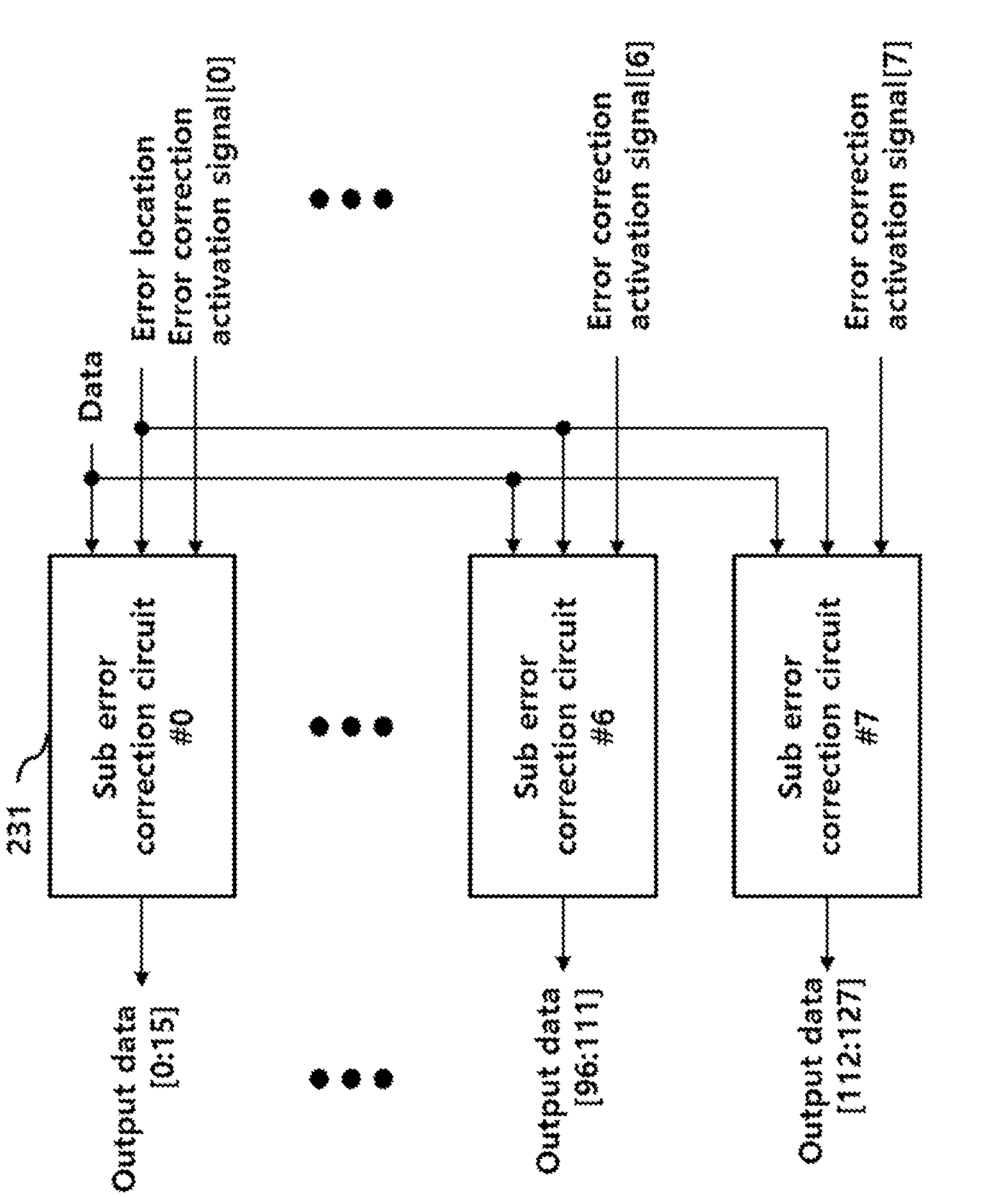
FIG. 7 illustrates an error correction circuit according to an embodiment of the present disclosure.

FIG. 7 is a block diagram showing the error correction circuit 230.

The error correction circuit 230 basically performs substantially the same function as an error correction circuit included in the conventional BCH decoder.

However, in embodiments of the present disclosure, error correction is activated or deactivated depending on error boundaries based on the error correction activation signal generated as described above.

To this end, the error correction circuit 230 includes a plurality of sub error correction circuits 231 corresponding to the plurality of error boundaries, respectively.

In this embodiment, since there are 8 data symbols in 16-bit units in the output codeword, the number of error boundaries is 8, and accordingly, the number of sub error correction circuits is 8.

Corresponding symbol of the data included in the output codeword and the error location output from the error detection circuit 220 are input to a corresponding sub error correction circuit 231.

In this embodiment, each sub error correction circuit 231 additionally receives a corresponding bit of the error correction activation signal.

For example, the 0th sub error correction circuit 231 receives 0th bit of the error correction activation signal.

Each sub error correction circuit 231 performs an error correction operation in the same manner as the error correction circuit included in the conventional BCH decoder when a corresponding bit of the error correction activation signal is activated and outputs corresponding symbol of the output data. For example, in the case of FIGS. 6A and 6C, the $1^{st}$ bit [1] of the error correction activation signal may have a first logic value (e.g., a logic high value) to make the corresponding sub error correction circuit #1 perform an error correction operation, whereas the remaining bits [0] and [2]-[7] of the error correction activation signal may have a second logic value (e.g., a logic low value) to prevent the corresponding sub error correction error circuits #0 and #2-#7 from performing an error correction operation. In the case of FIG. 6B, the entire bits [0]-[7] of the error correction activation signal may have the first logic value to make the sub error correction circuits #0-#7 each perform an error correction operation.

For example, the 0th sub error correction circuit 231 outputs 0th symbol of the output data, which corresponds to 16 bits from 0 to 15 among the output data.

Although various embodiments have been illustrated and described, various changes and modifications may be made to the described embodiments without departing from the spirit and scope of the invention as defined by the following claims.

What is claimed is:

1. A coding circuit comprising:

an encoder circuit configured to generate parity by applying input data to a parity generating matrix and generate an input codeword by concatenating the input data and the parity; and a decoder circuit configured to detect and correct an error included in an output codeword based on a first syndrome, a second syndrome, and a third syndrome for identifying an error boundary between adjacent symbols of the output codeword, the first, second, and third syndromes being generated by applying the output codeword to the parity generating matrix, wherein the encoder circuit comprises:

a first concatenation circuit configured to concatenate the input data and padding data;

a selection circuit configured to select an output of the first concatenation circuit or the output codeword;

a parity generator configured to apply an output of the selection circuit to the parity generating matrix; and a second concatenation circuit configured to generate the input codeword by concatenating the input data and an output of the parity generator.

2. The coding circuit of claim 1, wherein the selection circuit selects the output of the first concatenation circuit during a write operation and selects the output codeword during a read operation, and the parity generator generates the syndromes during the read operation.

3. A coding circuit comprising:

an encoder circuit configured to generate parity by applying input data to a parity generating matrix and generate an input codeword by concatenating the input data and the parity; and a decoder circuit configured to detect and correct an error included in an output codeword based on a first syndrome, a second syndrome, and a third syndrome for identifying an error boundary between adjacent symbols of the output codeword, the first, second, and third syndromes being generated by applying the output codeword to the parity generating matrix, wherein the parity generating matrix includes a first syndrome generating matrix to generate the first syndrome, a second syndrome generating matrix to generate the second syndrome, and a third syndrome generating matrix to generate the third syndrome when the output codeword is applied during a read operation, wherein the first syndrome generating matrix includes a plurality of odd error decision rows to determine whether an odd number of errors exist and includes a plurality of error boundary decision rows to determine a target error boundary where the error occurred among a plurality of error boundaries, wherein the third syndrome generating matrix includes a plurality of columns corresponding to the plurality of error boundaries, and wherein the target error boundary is determined based on the error boundary decision rows, the second syndrome, and the third syndrome.

4. The coding circuit of claim 3, wherein the decoder circuit includes:

an error boundary decision circuit to generate an error correction activation signal corresponding to the plurality of error boundaries based on the first syndrome, the second syndrome, and the third syndrome;

an error detection circuit to determine an error location from the second syndrome; and an error correction circuit to correct the error included in the output codeword based on the error location and to provide output data, wherein the error correction activation signal indicates whether the error correction circuit performs an error correction operation for one or more of the plurality of error boundaries.

5. The coding circuit of claim 4, wherein the error boundary decision circuit determines whether an odd number of errors exist or not based on a plurality of first values in a plurality of first rows of the first syndrome that correspond to the plurality of odd error decision rows.

6. The coding circuit of claim 5, wherein when the odd number of errors exist, the error boundary decision circuit determines the target error boundary based on a second value represented by a plurality of second rows of the first syndrome that correspond to the plurality of error boundary decision rows, and generates the error correction activation signal to perform the error correction operation only for the target error boundary.

7. The coding circuit of claim 6, wherein when the even number of errors exist, the error boundary decision circuit determines the target error boundary using the second syndrome and the third syndrome, generates the error correction activation signal to perform the error correction operation only for the target error boundary if the second value is the same as a predetermined value, and generates the error correction activation signal to perform the error correction operation for all the error boundaries if the second value is different from the predetermined value.

8. The coding circuit of claim 7, wherein the second syndrome includes a first portion and a second portion, and when the even number of errors exist, the error boundary decision circuit identifies the target error boundary using the first portion of the second syndrome and the third syndrome.

9. The coding circuit of claim 4, wherein the error correction circuit includes a plurality of sub error correction circuits corresponding to a plurality of symbols of data in the output codeword, and wherein each of the plurality of sub error correction circuits corrects an error of a corresponding symbol of the data in the output codeword based on the error location and the error correction activation signal.

10. A memory device comprising:

a memory cell array; and a coding circuit configured to provide an input codeword to the memory cell array by encoding input data, and to generate output data and a detection signal by decoding output codeword output from the memory cell array, wherein the coding circuit includes:

an encoder circuit configured to generate parity by applying the input data to a parity generating matrix and generate the input codeword by concatenating the input data and the parity; and a decoder circuit configured to detect and correct an error included in the output codeword based on a first syndrome, a second syndrome, and a third syndrome for identifying an error boundary between adjacent symbols of the output codeword, the first, second, and third syndromes being generated by applying the output codeword to the parity generating matrix, wherein the encoder circuit comprises:

a first concatenation circuit configured to concatenate the input data and padding data;

a selection circuit configured to select an output of the first concatenation circuit or the output codeword;

a parity generator configured to apply an output of the selection circuit to the parity generating matrix; and a second concatenation circuit configured to generate the input codeword by concatenating the input data and an output of the parity generator.

11. The memory device of claim 10, wherein the selection circuit selects the output of the first concatenation circuit during a write operation and selects the output codeword during a reading operation, and the parity generator generates the syndromes during the read operation.

12. A memory device comprising:

a memory cell array; and a coding circuit configured to provide an input codeword to the memory cell array by encoding input data, and to generate output data and a detection signal by decoding output codeword output from the memory cell array, wherein the coding circuit includes:

an encoder circuit configured to generate parity by applying the input data to a parity generating matrix and generate the input codeword by concatenating the input data and the parity; and a decoder circuit configured to detect and correct an error included in the output codeword based on a first syndrome, a second syndrome, and a third syndrome for identifying an error boundary between adjacent symbols of the output codeword, the first, second, and third syndromes being generated by applying the output codeword to the parity generating matrix, wherein the parity generating matrix includes a first syndrome generating matrix to generate the first syndrome, a second syndrome generating matrix to generate the second syndrome, and a third syndrome generating matrix to generate the third syndrome when the output codeword is applied during a read operation, wherein the first syndrome generating matrix includes a plurality of odd error decision rows to determine whether an odd number of errors exist and includes a plurality of error boundary decision rows to determine a target error boundary where the error occurred among a plurality of error boundaries, wherein the third syndrome generating matrix includes a plurality of columns corresponding to the plurality of error boundaries, and wherein the target error boundary is determined based on the error boundary decision rows, the second syndrome, and the third syndrome.

13. The memory device of claim 12, wherein the decoder circuit includes:

an error boundary decision circuit to generate an error correction activation signal corresponding to the plurality of error boundaries based on the first syndrome, the second syndrome, and the third syndrome;

an error detection circuit to determine an error location from the second syndrome; and an error correction circuit to correct the error included in the output codeword based on the error location and to provide output data, wherein the error correction activation signal indicates whether the error correction circuit performs an error correction operation for one or more of the plurality of error boundaries.

14. The memory device of claim 13, wherein the error boundary decision circuit determines whether an odd number of errors exists or not based on a plurality of first values in a plurality of first rows of the first syndrome that correspond to the plurality of odd error decision rows.

15. The memory device of claim 14, wherein when the odd number of errors exist, the error boundary decision circuit determines the target error boundary based on a second value represented by a plurality of second rows of the first syndrome that correspond to the plurality of error boundary decision rows, and generates the error correction activation signal to perform the error correction operation only for the target error boundary.

16. The memory device of claim 15, wherein when an even number of errors exist, the error boundary decision circuit determines the target error boundary using the second syndrome and the third syndrome, generates the error correction activation signal to perform the error correction operation only for the target error boundary if the second value is the same as a predetermined value, and generates the error correction activation signal to perform the error correction operation for all the error boundaries if the second value is different from the predetermined value.

17. The memory device of claim 16, wherein the second syndrome includes a first portion and a second portion, and when the even number of errors exist, the error boundary decision circuit identifies the target error boundary using the first portion of the second syndrome and the third syndrome.

18. The memory device of claim 13, wherein the error correction circuit includes a plurality of sub error correction circuits corresponding to a plurality of symbols of data in the output codeword, and wherein each of the plurality of sub error correction circuits corrects an error of a corresponding symbol of the data in the output codeword based on the error location and the error correction activation signal.

* * * * *